United States Patent
Britz

(10) Patent No.: US 11,794,382 B2
(45) Date of Patent: Oct. 24, 2023

(54) METHODS FOR DEPOSITING ANTI-COKING PROTECTIVE COATINGS ON AEROSPACE COMPONENTS

(71) Applicant: Applied Materials, Inc., Santa Clara, CA (US)

(72) Inventor: David A. Britz, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 740 days.

(21) Appl. No.: 16/542,968

(22) Filed: Aug. 16, 2019

(65) Prior Publication Data

US 2020/0361124 A1 Nov. 19, 2020

Related U.S. Application Data

(60) Provisional application No. 62/848,953, filed on May 16, 2019.

(51) Int. Cl.

| | | |
|---|---|---|
| *B29C 37/00* | (2006.01) | |
| *F01D 9/02* | (2006.01) | |
| *C23C 16/02* | (2006.01) | |
| *C23C 18/12* | (2006.01) | |
| *B08B 9/00* | (2006.01) | |
| *B64F 5/10* | (2017.01) | |
| *B64F 5/60* | (2017.01) | |
| *B05D 1/36* | (2006.01) | |
| *B05D 5/00* | (2006.01) | |
| *C23C 16/32* | (2006.01) | |
| *C23C 16/455* | (2006.01) | |
| *C23C 16/30* | (2006.01) | |
| *C23C 16/40* | (2006.01) | |
| *C23C 16/04* | (2006.01) | |
| *C23C 16/56* | (2006.01) | |
| *C23C 16/48* | (2006.01) | |

(52) U.S. Cl.
CPC ...... *B29C 37/0025* (2013.01); *B29C 37/0067* (2013.01); *C23C 16/0227* (2013.01); *C23C 18/1208* (2013.01); *F01D 9/02* (2013.01); *B05D 1/36* (2013.01); *B05D 5/00* (2013.01); *B08B 9/00* (2013.01); *B64F 5/10* (2017.01); *B64F 5/60* (2017.01); *C23C 16/04* (2013.01); *C23C 16/30* (2013.01); *C23C 16/32* (2013.01); *C23C 16/40* (2013.01); *C23C 16/455* (2013.01); *C23C 16/45525* (2013.01); *C23C 16/45563* (2013.01); *C23C 16/48* (2013.01); *C23C 16/56* (2013.01)

(58) Field of Classification Search
CPC ............ B29C 37/0025; B29C 37/0067; C23C 16/0227; C23C 16/04; C23C 16/30; C23C 16/32; C23C 16/40; C23C 16/455; C23C 16/45525; C23C 16/45563; C23C 16/48; C23C 16/56; F01D 5/288; F01D 5/30; F01D 9/02; B05D 1/36; B05D 5/00; B64F 5/10; B64F 5/60; B08B 9/00
USPC .................................................. 427/255.28
See application file for complete search history.

(56) References Cited

U.S. PATENT DOCUMENTS

| | | |
|---|---|---|
| 4,698,130 A | 10/1987 | Restall et al. |
| 5,217,757 A | 6/1993 | Olson et al. |
| 5,362,228 A | 11/1994 | Vaudel |
| 5,503,874 A | 4/1996 | Ackerman et al. |
| 5,950,925 A | 9/1999 | Fukunaga et al. |
| 6,042,898 A | 3/2000 | Burns et al. |
| 6,156,382 A | 12/2000 | Rajagopalan et al. |
| 6,162,715 A | 12/2000 | Mak et al. |
| 6,245,192 B1 | 6/2001 | Dhindsa et al. |
| 6,309,713 B1 | 10/2001 | Mak et al. |
| 6,332,926 B1 | 12/2001 | Pfaendtner et al. |
| 6,359,089 B2 | 3/2002 | Hung et al. |
| 6,379,466 B1 | 4/2002 | Sahin et al. |
| 6,402,898 B1 | 6/2002 | Brumer et al. |
| 6,437,066 B1 | 8/2002 | Hung et al. |
| 6,465,040 B2 | 10/2002 | Gupta et al. |

(Continued)

FOREIGN PATENT DOCUMENTS

| | | |
|---|---|---|
| CN | 104647828 A | 5/2015 |
| EP | 0209307 A1 | 1/1987 |

(Continued)

OTHER PUBLICATIONS

International Search Report and Written Opinion dated Oct. 30, 2020 for Application No. PCT/US2020/041382.

(Continued)

*Primary Examiner* — Brian K Talbot
(74) *Attorney, Agent, or Firm* — PATTERSON + SHERIDAN, LLP

(57) ABSTRACT

Embodiments of the present disclosure generally relate to protective coatings on an aerospace component and methods for depositing the protective coatings. The protective coating can be anti-coking coatings to reduce or suppress coke formation when the aerospace component is heated in the presence of a fuel. In one or more embodiments, a method for depositing the protective coating on an aerospace component includes exposing the aerospace component to a cleaning process to produce a cleaned surface on the aerospace component and sequentially exposing the aerospace component to a precursor and a reactant to form a protective coating on the cleaned surface of the aerospace component by an atomic layer deposition (ALD) process. The aerospace component can be one or more of a fuel nozzle, a combustor liner, a combustor shield, a heat exchanger, a fuel line, a fuel valve, or any combination thereof.

20 Claims, No Drawings

(56) References Cited

U.S. PATENT DOCUMENTS

| | | |
|---|---|---|
| 6,495,271 B1 | 12/2002 | Vakil |
| 6,551,929 B1 | 4/2003 | Kori et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,244 B1 | 10/2003 | Mao et al. |
| 6,677,247 B2 | 1/2004 | Yuan et al. |
| 6,740,585 B2 | 5/2004 | Yoon et al. |
| 6,784,096 B2 | 8/2004 | Chen et al. |
| 6,797,340 B2 | 9/2004 | Fang et al. |
| 6,800,376 B1 | 10/2004 | Gupta et al. |
| 6,805,750 B1 | 10/2004 | Ristau et al. |
| 6,809,026 B2 | 10/2004 | Yoon et al. |
| 6,811,814 B2 | 11/2004 | Chen et al. |
| 6,821,891 B2 | 11/2004 | Chen et al. |
| 6,825,134 B2 | 11/2004 | Law et al. |
| 6,827,978 B2 | 12/2004 | Yoon et al. |
| 6,831,021 B2 | 12/2004 | Chua et al. |
| 6,833,161 B2 | 12/2004 | Wang et al. |
| 6,838,125 B2 | 1/2005 | Chung et al. |
| 6,846,516 B2 | 1/2005 | Yang et al. |
| 6,869,838 B2 | 3/2005 | Law et al. |
| 6,872,429 B1 | 3/2005 | Chen et al. |
| 6,905,939 B2 | 6/2005 | Yuan et al. |
| 6,911,391 B2 | 6/2005 | Yang et al. |
| 6,924,191 B2 | 8/2005 | Liu et al. |
| 6,936,538 B2 | 8/2005 | Byun |
| 6,939,801 B2 | 9/2005 | Chung et al. |
| 6,939,804 B2 | 9/2005 | Lai et al. |
| 6,949,342 B2 | 9/2005 | Golub et al. |
| 6,951,804 B2 | 10/2005 | Seutter et al. |
| 6,972,267 B2 | 12/2005 | Cao et al. |
| 7,011,947 B2 | 3/2006 | Golub et al. |
| 7,026,238 B2 | 4/2006 | Xi et al. |
| 7,041,335 B2 | 5/2006 | Chung |
| 7,049,226 B2 | 5/2006 | Chung et al. |
| 7,081,271 B2 | 7/2006 | Chung et al. |
| 7,101,795 B1 | 9/2006 | Xi et al. |
| 7,211,144 B2 | 5/2007 | Lu et al. |
| 7,211,508 B2 | 5/2007 | Chung et al. |
| 7,241,686 B2 | 7/2007 | Marcadal et al. |
| 7,244,683 B2 | 7/2007 | Chung et al. |
| 7,262,133 B2 | 8/2007 | Chen et al. |
| 7,264,846 B2 | 9/2007 | Chang et al. |
| 7,265,048 B2 | 9/2007 | Chung et al. |
| 7,279,432 B2 | 10/2007 | Xi et al. |
| 7,285,312 B2 | 10/2007 | Li |
| 7,317,229 B2 | 1/2008 | Hung et al. |
| 7,371,467 B2 | 5/2008 | Han et al. |
| 7,396,565 B2 | 7/2008 | Yang et al. |
| 7,404,985 B2 | 7/2008 | Chang et al. |
| 7,405,158 B2 | 7/2008 | Lai et al. |
| 7,416,979 B2 | 8/2008 | Yoon et al. |
| 7,429,402 B2 | 9/2008 | Gandikota et al. |
| 7,429,540 B2 | 9/2008 | Olsen |
| 7,439,191 B2 | 10/2008 | Law et al. |
| 7,473,655 B2 | 1/2009 | Wang et al. |
| 7,501,248 B2 | 3/2009 | Golub et al. |
| 7,507,660 B2 | 3/2009 | Chen et al. |
| 7,531,468 B2 | 5/2009 | Metzner et al. |
| 7,547,952 B2 | 6/2009 | Metzner et al. |
| 7,569,501 B2 | 8/2009 | Metzner et al. |
| 7,573,586 B1 | 8/2009 | Boyer et al. |
| 7,585,762 B2 | 9/2009 | Shah et al. |
| 7,595,263 B2 | 9/2009 | Chung et al. |
| 7,601,652 B2 | 10/2009 | Singh et al. |
| 7,651,955 B2 | 1/2010 | Ranish et al. |
| 7,732,327 B2 | 6/2010 | Lee et al. |
| 7,737,028 B2 | 6/2010 | Wang et al. |
| 7,776,395 B2 | 8/2010 | Mahajani |
| 7,816,200 B2 | 10/2010 | Kher |
| 7,824,743 B2 | 11/2010 | Lee et al. |
| 7,833,358 B2 | 11/2010 | Chu et al. |
| 7,846,840 B2 | 12/2010 | Kori et al. |
| 7,867,900 B2 | 1/2011 | Lee et al. |
| 7,875,119 B2 | 1/2011 | Gartland et al. |
| 7,910,165 B2 | 3/2011 | Ganguli et al. |
| 7,910,231 B2 | 3/2011 | Schuh et al. |
| 7,910,446 B2 | 3/2011 | Ma et al. |
| 7,964,505 B2 | 6/2011 | Khandelwal et al. |
| 7,972,978 B2 | 7/2011 | Mahajani |
| 8,043,907 B2 | 10/2011 | Ma et al. |
| 8,056,652 B2 | 11/2011 | Lockwood et al. |
| 8,227,078 B2 | 7/2012 | Morra et al. |
| 8,277,670 B2 | 10/2012 | Heo et al. |
| 8,470,460 B2 | 6/2013 | Lee |
| 8,721,812 B2 | 5/2014 | Furrer et al. |
| 8,741,420 B2 | 6/2014 | Bunker et al. |
| 8,871,297 B2 | 10/2014 | Barnett et al. |
| 9,255,327 B2 | 2/2016 | Winter et al. |
| 9,347,145 B2 | 5/2016 | Bessho |
| 9,683,281 B2 | 6/2017 | Meehan et al. |
| 9,777,583 B2 | 10/2017 | Leggett |
| 9,873,940 B2 | 1/2018 | Xu et al. |
| 10,072,335 B2 | 9/2018 | Marquardt et al. |
| 10,287,899 B2 | 5/2019 | Dierberger |
| 10,369,593 B2 | 8/2019 | Barnett et al. |
| 10,443,142 B2 | 10/2019 | Miettinen et al. |
| 10,488,332 B2 | 11/2019 | Kessler et al. |
| 10,633,740 B2* | 4/2020 | Melnik .......... C23C 16/40 |
| 10,741,411 B2* | 8/2020 | Niskanen ...... H01L 21/30621 |
| 11,028,480 B2* | 6/2021 | Knisley .......... F01D 25/12 |
| 11,473,197 B2* | 10/2022 | Task .......... C23C 16/45555 |
| 2002/0002258 A1 | 1/2002 | Hung et al. |
| 2002/0045782 A1 | 4/2002 | Hung et al. |
| 2002/0117399 A1 | 8/2002 | Chen et al. |
| 2002/0127336 A1 | 9/2002 | Chen et al. |
| 2002/0136824 A1 | 9/2002 | Gupta et al. |
| 2003/0010451 A1 | 1/2003 | Tzu et al. |
| 2003/0057526 A1 | 3/2003 | Chung et al. |
| 2003/0059535 A1 | 3/2003 | Luo et al. |
| 2003/0059538 A1 | 3/2003 | Chung et al. |
| 2003/0072884 A1 | 4/2003 | Zhang et al. |
| 2003/0082301 A1 | 5/2003 | Chen et al. |
| 2003/0123216 A1 | 7/2003 | Yoon et al. |
| 2003/0124262 A1 | 7/2003 | Chen et al. |
| 2003/0132319 A1 | 7/2003 | Hytros et al. |
| 2003/0134300 A1 | 7/2003 | Golub et al. |
| 2003/0136520 A1 | 7/2003 | Yudovsky et al. |
| 2003/0139005 A1 | 7/2003 | Song et al. |
| 2003/0145875 A1 | 8/2003 | Han et al. |
| 2003/0152980 A1 | 8/2003 | Golub et al. |
| 2003/0157760 A1 | 8/2003 | Xi et al. |
| 2003/0172872 A1 | 9/2003 | Thakur et al. |
| 2003/0198754 A1 | 10/2003 | Xi et al. |
| 2003/0203616 A1 | 10/2003 | Chung et al. |
| 2003/0215570 A1 | 11/2003 | Seutter et al. |
| 2003/0235961 A1 | 12/2003 | Metzner et al. |
| 2004/0009665 A1 | 1/2004 | Chen et al. |
| 2004/0013803 A1 | 1/2004 | Chung et al. |
| 2004/0018738 A1 | 1/2004 | Liu |
| 2004/0079648 A1 | 4/2004 | Khan et al. |
| 2004/0161628 A1 | 8/2004 | Gupta et al. |
| 2004/0171280 A1* | 9/2004 | Conley, Jr. ...... H01L 21/28202 438/785 |
| 2005/0003310 A1 | 1/2005 | Bai et al. |
| 2005/0008780 A1 | 1/2005 | Ackerman et al. |
| 2005/0019593 A1 | 1/2005 | Mancini et al. |
| 2005/0053467 A1 | 3/2005 | Ackerman et al. |
| 2005/0085031 A1 | 4/2005 | Lopatin et al. |
| 2005/0126593 A1 | 6/2005 | Budinger et al. |
| 2005/0158590 A1 | 7/2005 | Li |
| 2005/0255329 A1 | 11/2005 | Hazel |
| 2005/0260347 A1 | 11/2005 | Narwankar et al. |
| 2005/0260357 A1 | 11/2005 | Olsen et al. |
| 2005/0271813 A1 | 12/2005 | Kher et al. |
| 2006/0008838 A1 | 1/2006 | Golub et al. |
| 2006/0019032 A1 | 1/2006 | Wang et al. |
| 2006/0019033 A1 | 1/2006 | Muthukrishnan et al. |
| 2006/0021633 A1 | 2/2006 | Harvey |
| 2006/0024734 A1 | 2/2006 | Golub et al. |
| 2006/0029971 A1 | 2/2006 | Golub et al. |
| 2006/0040052 A1 | 2/2006 | Fang et al. |

(56) References Cited

U.S. PATENT DOCUMENTS

| | | |
|---|---|---|
| 2006/0057630 A1 | 3/2006 | Golub et al. |
| 2006/0062917 A1 | 3/2006 | Muthukrishnan et al. |
| 2006/0084283 A1 | 4/2006 | Paranjpe et al. |
| 2006/0148180 A1 | 7/2006 | Ahn et al. |
| 2006/0153995 A1 | 7/2006 | Narwankar et al. |
| 2006/0228895 A1 | 10/2006 | Chae et al. |
| 2006/0246213 A1 | 11/2006 | Moreau et al. |
| 2006/0286819 A1 | 12/2006 | Seutter et al. |
| 2007/0009658 A1 | 1/2007 | Yoo et al. |
| 2007/0009660 A1 | 1/2007 | Sasaki et al. |
| 2007/0023142 A1 | 2/2007 | LaGraff et al. |
| 2007/0049043 A1 | 3/2007 | Muthukrishnan et al. |
| 2007/0054487 A1 | 3/2007 | Ma et al. |
| 2007/0065578 A1 | 3/2007 | McDougall |
| 2007/0099415 A1 | 5/2007 | Chen et al. |
| 2007/0134518 A1 | 6/2007 | Feist et al. |
| 2007/0202254 A1 | 8/2007 | Ganguli et al. |
| 2007/0259111 A1 | 11/2007 | Singh et al. |
| 2007/0274837 A1 | 11/2007 | Taylor et al. |
| 2008/0032510 A1 | 2/2008 | Olsen |
| 2008/0038578 A1 | 2/2008 | Li |
| 2008/0056905 A1 | 3/2008 | Golecki |
| 2008/0090425 A9 | 4/2008 | Olsen |
| 2008/0113095 A1 | 5/2008 | Gorman et al. |
| 2008/0121962 A1* | 5/2008 | Forbes .............. H01L 21/28194 257/310 |
| 2008/0135914 A1 | 6/2008 | Krishna et al. |
| 2008/0268154 A1 | 10/2008 | Kher et al. |
| 2008/0268635 A1 | 10/2008 | Yu et al. |
| 2009/0004386 A1 | 1/2009 | Makela et al. |
| 2009/0004850 A1 | 1/2009 | Ganguli et al. |
| 2009/0053426 A1 | 2/2009 | Lu et al. |
| 2009/0061613 A1 | 3/2009 | Choi et al. |
| 2009/0098289 A1 | 4/2009 | Deininger et al. |
| 2009/0098346 A1 | 4/2009 | Li |
| 2009/0155976 A1 | 6/2009 | Ahn et al. |
| 2009/0239061 A1 | 9/2009 | Hazel et al. |
| 2009/0269507 A1 | 10/2009 | Yu et al. |
| 2009/0286400 A1 | 11/2009 | Heo et al. |
| 2010/0062149 A1 | 3/2010 | Ma et al. |
| 2010/0062614 A1 | 3/2010 | Ma et al. |
| 2010/0075499 A1 | 3/2010 | Olsen |
| 2010/0110451 A1 | 5/2010 | Biswas et al. |
| 2010/0120245 A1 | 5/2010 | Tjandra et al. |
| 2010/0159150 A1 | 6/2010 | Kirby et al. |
| 2010/0167527 A1 | 7/2010 | Wu et al. |
| 2010/0239758 A1 | 9/2010 | Kher et al. |
| 2010/0252151 A1 | 10/2010 | Furrer et al. |
| 2010/0270609 A1 | 10/2010 | Olsen et al. |
| 2010/0279018 A1 | 11/2010 | Hazel et al. |
| 2011/0175038 A1 | 7/2011 | Hou et al. |
| 2011/0293825 A1 | 12/2011 | Atwal et al. |
| 2012/0024403 A1* | 2/2012 | Gage .................. F02C 7/222 137/561 R |
| 2012/0040084 A1 | 2/2012 | Fairbourn |
| 2012/0082783 A1 | 4/2012 | Barnett et al. |
| 2012/0148944 A1 | 6/2012 | Oh et al. |
| 2012/0276306 A1 | 11/2012 | Ueda |
| 2012/0318773 A1 | 12/2012 | Wu et al. |
| 2013/0048605 A1 | 2/2013 | Sapre et al. |
| 2013/0164456 A1 | 6/2013 | Winter et al. |
| 2013/0292655 A1 | 11/2013 | Becker et al. |
| 2014/0103284 A1 | 4/2014 | Hsueh et al. |
| 2014/0264297 A1 | 9/2014 | Kumar et al. |
| 2014/0271220 A1 | 9/2014 | Leggett |
| 2015/0017324 A1 | 1/2015 | Barnett et al. |
| 2015/0184296 A1 | 7/2015 | Xu et al. |
| 2015/0221541 A1 | 8/2015 | Nemani et al. |
| 2016/0010472 A1 | 1/2016 | Murphy et al. |
| 2016/0060758 A1 | 3/2016 | Marquardt et al. |
| 2016/0181627 A1 | 6/2016 | Roeder et al. |
| 2016/0251972 A1 | 9/2016 | Dierberger |
| 2016/0281230 A1 | 9/2016 | Varadarajan et al. |
| 2016/0298222 A1* | 10/2016 | Meehan ................ C23C 14/022 |
| 2016/0300709 A1 | 10/2016 | Posseme et al. |
| 2016/0328635 A1 | 11/2016 | Dave et al. |
| 2016/0333493 A1 | 11/2016 | Miettinen et al. |
| 2016/0333494 A1 | 11/2016 | Miettinen et al. |
| 2017/0076968 A1 | 3/2017 | Wang et al. |
| 2017/0084425 A1 | 3/2017 | Uziel et al. |
| 2017/0158978 A1 | 6/2017 | Montagne et al. |
| 2017/0159198 A1 | 6/2017 | Miettinen et al. |
| 2017/0213570 A1 | 7/2017 | Cheng et al. |
| 2017/0233930 A1 | 8/2017 | Keuleers et al. |
| 2017/0292445 A1 | 10/2017 | Nelson et al. |
| 2017/0314125 A1* | 11/2017 | Fenwick ............... C23C 16/403 |
| 2018/0006215 A1 | 1/2018 | Jeong et al. |
| 2018/0105932 A1 | 4/2018 | Fenwick et al. |
| 2018/0127868 A1 | 5/2018 | Xu et al. |
| 2018/0156725 A1 | 6/2018 | Kessler et al. |
| 2018/0261516 A1 | 9/2018 | Lin et al. |
| 2018/0261686 A1 | 9/2018 | Lin et al. |
| 2018/0329189 A1 | 11/2018 | Banna et al. |
| 2018/0339314 A1 | 11/2018 | Bhoyar et al. |
| 2018/0351164 A1 | 12/2018 | Hellmich et al. |
| 2018/0358229 A1 | 12/2018 | Koshizawa et al. |
| 2019/0019690 A1 | 1/2019 | Choi et al. |
| 2019/0032194 A2 | 1/2019 | Dieguez-Campo et al. |
| 2019/0079388 A1 | 3/2019 | Fender et al. |
| 2019/0088543 A1 | 3/2019 | Lin et al. |
| 2019/0130731 A1 | 5/2019 | Hassan et al. |
| 2019/0271076 A1 | 9/2019 | Fenwick et al. |
| 2019/0274692 A1 | 9/2019 | Lampropoulos et al. |
| 2019/0284686 A1 | 9/2019 | Melnik et al. |
| 2019/0284692 A1 | 9/2019 | Melnik et al. |
| 2019/0284693 A1 | 9/2019 | Task |
| 2019/0284694 A1 | 9/2019 | Knisley et al. |
| 2019/0287808 A1 | 9/2019 | Goradia et al. |
| 2019/0311900 A1 | 10/2019 | Pandit et al. |
| 2019/0311909 A1 | 10/2019 | Bajaj et al. |
| 2019/0330746 A1 | 10/2019 | Britz et al. |
| 2019/0382879 A1 | 12/2019 | Jindal et al. |
| 2020/0027767 A1 | 1/2020 | Zang et al. |
| 2020/0043722 A1 | 2/2020 | Cheng et al. |
| 2020/0240018 A1 | 7/2020 | Melnik et al. |
| 2020/0340107 A1 | 10/2020 | Chatterjee et al. |
| 2020/0361124 A1* | 11/2020 | Britz .................. C23C 16/0227 |
| 2020/0392626 A1 | 12/2020 | Chatterjee et al. |
| 2021/0292901 A1 | 9/2021 | Knisley et al. |
| 2022/0298920 A1 | 9/2022 | Melnik et al. |

FOREIGN PATENT DOCUMENTS

| | | |
|---|---|---|
| EP | 0387113 B1 | 12/1993 |
| EP | 1431372 A2 | 6/2004 |
| EP | 1236812 B1 | 5/2006 |
| EP | 2022868 A2 | 2/2009 |
| EP | 2103707 A1 | 9/2009 |
| EP | 2194164 A1 | 6/2010 |
| EP | 2392895 A1 | 12/2011 |
| EP | 2161352 B1 | 2/2014 |
| JP | H6240460 A | 8/1994 |
| JP | 2823086 B2 | 11/1998 |
| JP | 2001342556 A | 12/2001 |
| JP | 2003013745 * | 1/2003 |
| JP | 2003013745 A | 1/2003 |
| JP | 2003164819 A | 6/2003 |
| JP | 2003531291 A | 10/2003 |
| JP | 2006010403 A | 1/2006 |
| JP | 2006199988 A | 8/2006 |
| JP | 2013167012 A | 8/2013 |
| JP | 2016520717 A | 7/2016 |
| KR | 20060106104 A | 10/2006 |
| KR | 20110014989 A | 2/2011 |
| KR | 101192248 B1 | 10/2012 |
| KR | 20170063149 A | 6/2017 |
| KR | 101761736 B1 | 7/2017 |
| KR | 20170140354 A | 12/2017 |
| RU | 2630733 C2 | 9/2017 |
| RU | 2630733 * | 12/2017 |
| SG | 11202008268 R | 10/2020 |
| TW | 201812075 A | 4/2018 |
| WO | 9631687 A1 | 10/1996 |
| WO | 00/09778 A1 | 2/2000 |

(56) References Cited

FOREIGN PATENT DOCUMENTS

| WO | 2005059200 A1 | 6/2005 | |
| WO | 2014159267 A1 | 10/2014 | |
| WO | 2015047783 A1 | 4/2015 | |
| WO | 2019182967 A1 | 9/2019 | |
| WO | WO-2019182967 A1 * | 9/2019 | ........... C23C 16/045 |
| WO | 2021071567 A1 | 4/2021 | |

OTHER PUBLICATIONS

Growth mechanism of Cr2O3 scales: oxygen diffusion and chromium, oxidation kinetics and effect of yttrium, Materials Science and Engineering A212 (1996) 6-13.

The Role of Active Elements in the Oxidation Behaviour of HighTemperature Metals and Alloys, E. Lang, Dec. 6, 2012 (pp. 111-129 and 153).

Volatility and High Thermal Stability in Mid to Late First Row Transition Metal Diazadienyl Complexes; Organometallics 2011, 30, 5010-5017.

A Review on Alumina-Chrome (Al2O3—Cr2O3) and Chrome-Silica (Cr2O3—SiO2) Refractories Along With Their Binary Phase Diagrams; http://www.idc-online.com/technical_references/pdfs/chemical_engineering/A_Review_on_Alumina_Chrome.pdf.

Oxidation and Hot Corrosion of Superalloys; http://www.tms.org/superalloys/10.7449/1984/Superalloys_1984_651_687.pdf.

International Search Report and Written Opinion dated Jul. 2, 2019 for Application No. PCT/US2019/022788.

International Search Report and Writtne Opinion dated Jul. 2, 2019 for Application No. PCT/US2019/022737.

International Search Report and Written Opinion dated Jun. 28, 2019 for Application No. PCT/US2019-022709.

Leppaniemi, Jarmo, et al., "Corrosion protection of steel with multilayer coatings: Improving the sealing properties of physical vapor deposition CrN coatings with Al203/Ti02atomic layer deposition nanolaminates". Thin Solid Films 627 (2017) pp. 59-68.

Ali, Muhammad Rostom, et al., "Electrodeposition of aluminum-chromium alloys from Al&BPC melt and its corrosion and high temperature oxidation behaviors". Electrochimica Acta, vol. 42. No. 15., pp. 2347-2354, 1997.

Wu, Yanlin, et al., "Atomic Layer Deposition from Dissolved Precursors". Nano Letters 2015, 15, 6379-6385.

Johnson, Andrew L., et al., "Recent developments in molecular precursors for atomic layer deposition". Organomet. Chem., 2019, 42, 1-53.

Haukka, Suvi, et al., "Chemisorption of chromium acetylacetonate on porous high surface area silica". Applied Surface Science, vol. 75, Issues 1-4, Jan. 2, 1994, pp. 220-227. Abstract Only.

Kaloyeros et al. "Review-Silicon Nitrtide and Silicon Nitride-Rich Thin Film Technologies: Trends in Deposition Technniques and Related Application". ECS Journal of Solid State Science and Technology, 6 (10) p. 691-p. 714 (2017).

Heidary et al. "Study on the behavior of atomic layer deposition coatings on a nickel substrate at high temperature," Nanotechnology, 27, 245701, 2016, pp. 1-32.

Bensch et al. "Modeling of the Influence of Oxidation of Thin-Walled Specimens of Single Crystal Superalloys," Superalloys 2012: 12th International Symposium on Superalloys, The Minerals, Metals & Materials Society, pp. 331-340, <https://www.tms.org/superalloys/10.7449/2012/Superalloys_2012_331_340.pdf>.

Fujita et al. "Sintering of Al2O3-Cr2O3 Powder Prepared by Sol-Gel Process," Journal of the Society of Materials Science, Japan, vol. 56, No. 6, Jun. 2007, pp. 526-530, <http://www.ecm.okayama-u.ac.jp/ceramics/Research/Papers/2007/Fujita_JSMS56(2007)526.pdf>.

Hirata et al. "Corrosion Resistance of Alumina-Chromia Ceramic Materials against Molten Slag," Materials Transactions, vol. 43, No. 10, 2002, pp. 2561-2567, <https://www.jim.or.jp/journal/e/pdf3/43/10/2561.pdf>.

Vargas Garcia et al. "Thermal barrier coatings produced by chemical vapor deposition," Science and Technology of Advanced Materials, vol. 4, No. 4, 2003, pp. 397-402.

Dyer et al. "CVD Tungsten Carbide and Titanium Carbide Coatings for Aerospace Components," SAE Transactions, vol. 98, Section 1: Journal of Aerospace (1989), pp. 64-70. Abstract Only.

He et al. "Role of annealing temperatures on the evolution of microstructure and properties of Cr2O3 films," Applied Surface Science, vol. 357, Part B, Dec. 1, 2015, pp. 1472-1480, <https://doi.org/10.1016/j.apsusc.2015.10.023>.

International Search Report and Written Opinion dated Jul. 6, 2020 for Application No. PCT/US2020/024285.

Liu et al., "Ultrathin high-temperature oxidation-resistant coatings of hexagonal boron nitride" Nature Communications; doi: 10.1038/ncomms3541; Pub. Oct. 4, 2013, 8 pages.

International Search Report and the Written Opinion for International Application No. PCT/US2020/028462 dated Jul. 29, 2020, 11 pages.

International Search Report and Written Report dated Jul. 31, 2020 for Application No. PCT/US2020/027247.

W. Auwarter, "Hexagonal boron nitride monolayers on metal supports: Versatile templates for atoms, molecules and nanostructures", Surface Science Reports 74 (2019) 1-95.

Calderon, "Boron Nitride Growth and Electronics", Cornell University, May 2018.

PCT Notification of Transmittal of the International Search Report and the Written Opinion of the International Searching Authority for International Application No. PCT/US2019/019113; dated Jun. 10, 2019; 11 total pages.

Taiwan Office Action dated Apr. 22, 2020 for Application No. 108106406.

PCT International Search Report and the Written Opinion for International Application No. PCT/US2019/041181; dated Oct. 25, 2019; 15 total pages.

International Search Report and Written Opinion dated Jun. 24, 2020 for Application No. PCT/US2020/019151.

Taiwan Office Action dated Dec. 21, 2020 for Application No. 109113600.

International Search Report and Written Opinion dated Feb. 2, 2021 for Application No. PCT/US2020/056618.

Taiwan Office Action dated May 10, 2021 for Application No. 109126499.

European Search Report dated Jul. 26, 2021 for Application No. 19793402.9.

International Search Report and Written Opinion dated Sep. 28, 2021 for Application No. PCT/US2021/035874.

Extended European Search Report dated Oct. 4, 2021 for Application No. 19793402.9.

Taiwan Office Action dated Oct. 7, 2021 for Application No. 109126499.

International Search Report dated Dec. 1, 2021 for Application No. PCT/US2021/046245.

International Search Report and Written Opinion dated Dec. 2, 2021 for Application No. PCT/US2021/045766.

Wang et al., "Hydrogen permeation properties of CrxCy@Cr2O3/Al2O3 composite coating derived from selective oxidation of a Cr-C alloy and atomic layer deposition", International Journal of Hydrogen Energy, 43 (2018) pp. 21133-21141.

Liu et al., "Microstructural evolution of the interface between NiCrAlY coating and superalloy during isothermal oxidation", Materials and Design, 80 (2015) pp. 63-69.

Japanese Office Action dated Feb. 21, 2023 for Application No. 2021-567823.

Singapore Written Opinion dated May 15, 2023 for Application No. 11202112205W.

Extended Eurpoean Search Report dated Jan. 3, 2023 for Application No. 20804791.0.

* cited by examiner

METHODS FOR DEPOSITING ANTI-COKING PROTECTIVE COATINGS ON AEROSPACE COMPONENTS

CROSS-REFERENCE TO RELATED APPLICATIONS

This application claims benefit of U.S. Appl. No. 62/848,953, filed on May 16, 2019, which is herein incorporated by reference.

BACKGROUND

Field

Embodiments of the present disclosure generally relate to deposition processes, and in particular to vapor deposition processes for depositing films on aerospace components.

Description of the Related Art

Coking is a known problem in fuel nozzles due to high temperatures (e.g., about 600° C. to about 1,000° C.), a fuel-rich environment in the nozzle and in the combustor, and a metallic surface that can nucleate the deposition of carbon. Because fuel nozzles are complex in geometry and have high aspect ratio passages, it is difficult to coat those passages with a coating that resists coking.

Current approaches reducing coking in the turbine industry are largely based on mechanical techniques, such as control the temperature of the part, control fuel flows, or adding inserts. Ceramic inserts are used at the exit of the fuel nozzle, as are ceramics PVD/thermal sprayed thermal barrier-type coatings. However, ceramics are expensive and prone to cracking. Ceramics and thermal barrier coatings are not suitable to high aspect ratio, complex structures.

Therefore, improved protective coatings and methods for depositing the protective coatings on aerospace components are needed.

SUMMARY

Embodiments of the present disclosure generally relate to protective coatings on aerospace components and methods for depositing the protective coatings. The protective coatings are also anti-coking coatings to reduce or suppress coke formation when the aerospace component is heated in the presence of a fuel in a reducing environment. In one or more embodiments, a method for depositing a protective coating on an aerospace component includes exposing the aerospace component to a cleaning process to produce a cleaned surface on the aerospace component and sequentially exposing the aerospace component to a precursor and a reactant to form a protective coating on the cleaned surface of the aerospace component by an atomic layer deposition (ALD) process. The aerospace component can be one or more of a fuel nozzle, a combustor liner, a combustor shield, a heat exchanger, a fuel line, a fuel valve, or any combination thereof.

In other embodiments, a method for depositing a coating on an aerospace component includes exposing the aerospace component to a cleaning process to produce a cleaned surface on the aerospace component, where the aerospace component is a fuel nozzle, a combustor liner, a combustor shield, a heat exchanger, a fuel line, a fuel valve, or any combination thereof, where the cleaned surface of the aerospace component is an interior surface of the aerospace component, and where the cleaned surface of the aerospace component has an aspect ratio of about 5 to about 1,000. The method further includes sequentially exposing the aerospace component to a precursor and a reactant to form a protective coating on the cleaned surface of the aerospace component by an ALD process.

In some embodiments, a method for depositing a coating on an aerospace component includes exposing the aerospace component to a cleaning process to produce a cleaned surface on the aerospace component, where the cleaned surface of the aerospace component is an interior surface of the aerospace component, and where the cleaned surface of the aerospace component has an aspect ratio of about 5 to about 1,000. The method also includes sequentially exposing the aerospace component to a precursor and a reactant to form a protective coating on the cleaned surface of the aerospace component by an ALD process, where the protective coating has a thickness of about 10 nm to about 5,000 nm, and where the protective coating has a thickness variation of less than 50%.

DETAILED DESCRIPTION

Embodiments of the present disclosure generally relate to protective coatings on aerospace components and methods for depositing the protective coatings. The protective coatings are also anti-coking coatings to reduce or suppress coke formation when the aerospace component is heated in the presence of a fuel. The protective coatings can be or include monolayer films, multi-layer films, nanolaminate film stacks, coalesced films, crystalline films, or any combination thereof.

In one or more embodiments, a method for depositing a protective coating on an aerospace component includes exposing the aerospace component to one or more cleaning processes to produce a cleaned surface on the aerospace component and sequentially exposing the aerospace component to one or more precursors and/or one or more reactants to form a protective coating on the cleaned surface of the aerospace component by an atomic layer deposition (ALD) process.

In some embodiments, the aerospace component as described and discussed herein can be or include one or more of a fuel nozzle, a combustor liner, a combustor shield, a heat exchanger, a fuel line, a fuel valve, any other part or portion that is exposed to a fuel (e.g., aviation fuel or jet fuel) or any combination thereof. In other embodiments, the aerospace components as described and discussed herein can be or include one or more turbine blades, turbine vanes, ribs, fins, pin fins, or any other aerospace component or part that can benefit from having protective coating deposited thereon. The protective coatings can be deposited or otherwise formed on interior surfaces and/or exterior surfaces of the aerospace components.

Clean Process

Prior to producing the protective coating, the aerospace component can optionally be exposed to one or more cleaning processes. One or more contaminants are removed from the aerospace component to produce the cleaned surface during the cleaning process. The contaminant can be or include oxides, organics or organic residues, carbon, oil, soil, particulates, debris, and/or other contaminants, or any combination thereof. These contaminants are removed prior to producing the protective coating on the aerospace component.

The cleaning process can be or include one or more basting or texturing processes, vacuum purges, solvent clean, acid clean, basic or caustic clean, wet clean, ozone clean, plasma clean, sonication, or any combination thereof. Once cleaned and/or textured, the subsequently deposited protective coating has stronger adhesion to the cleaned surfaces or otherwise altered surfaces of the aerospace component than if otherwise not exposed to the cleaning process.

In one or more examples, the surfaces of the aerospace component can be blasted with or otherwise exposed to beads, sand, carbonate, or other particulates to remove oxides and other contaminates therefrom and/or to provide texturing to the surfaces of the aerospace component. In some examples, the aerospace component can be placed into a chamber within a pulsed push-pull system and exposed to cycles of purge gas or liquid (e.g., $N_2$, Ar, He, one or more alcohols (methanol, ethanol, propanol, and/or others), $H_2O$, or any combination thereof) and vacuum purges to remove debris from small holes on the aerospace component. In other examples, the surfaces of the aerospace component can be exposed to hydrogen plasma, oxygen or ozone plasma, and/or nitrogen plasma, which can be generated in a plasma chamber or by a remote plasma system.

In some examples, such as for organic removal or oxide removal, the surfaces of the aerospace component can be exposed to a hydrogen plasma, then degassed, then exposed to ozone treatment. In other examples, such as for organic removal, the surfaces of the aerospace component can be exposed to a wet clean that includes: soaking in an alkaline degreasing solution, rinsing, exposing the surfaces to an acid clean (e.g., sulfuric acid, phosphoric acid, hydrochloric acid, hydrofluoric acid, or any combination thereof), rinsing, and exposing the surfaces deionized water sonication bath. In some examples, such as for oxide removal, the surfaces of the aerospace component can be exposed to a wet clean that includes: exposing the surfaces to a dilute acid solution (e.g., acetic acid hydrochloric acid, hydrofluoric acid, or combinations thereof), rinsing, and exposing the surfaces deionized water sonication bath. In one or more examples, such as for particle removal, the surfaces of the aerospace component can be exposed to sonication (e.g., megasonication) and/or a supercritical fluid (carbon dioxide, water, one or more alcohols) wash, followed by exposing to cycles of purge gas or liquid (e.g., $N_2$, Ar, He, one or more alcohols, $H_2O$, or any combination thereof) and vacuum purges to remove particles from and dry the surfaces. In some examples, the aerospace component can be exposed to heating or drying processes, such as heating the aerospace component to a temperature of about 50° C., about 65° C., or about 80° C. to about 100° C., about 120° C., or about 150° C. and exposing to surfaces to the purge gas. The aerospace component can be heated in an oven or exposed to lamps for the heating or drying processes. Optionally, hot gas can be forced through internal passages to accelerate drying. Optionally, the component can be dried in reduced atmosphere without heating or with heating.

In various embodiments, the cleaned surface of the aerospace component can be one or more interior surfaces and/or one or more exterior surfaces of the aerospace component. The cleaned surface of the aerospace component can be or include one or more material, such as nickel, nickel superalloy, stainless steel, cobalt, chromium, molybdenum, iron, titanium, alloys thereof, or any combination thereof. In one or more examples, the cleaned surface of the aerospace component has an aspect ratio of about 5 to about 1,000, such as about 20 to about 500.

In some examples, the protective coating has a thickness of about 10 nm to about 5,000 nm, about 100 nm to about 4,000 nm, or about 500 nm to about 2,000 nm. Also, the protective coating can have a thickness variation of less than 200%, less than 100%, less than 25%, less than 5%, or less than 0.5%.

Vapor Deposition Process

In one or more embodiments, the protective coating reduces or suppresses coke formation when the aerospace component is heated in the presence of a fuel, such as an aviation fuel, jet fuel, kerosene, or the like. In some examples, the protective coating can be or include one or more material, such as aluminum oxide, aluminum nitride, aluminum oxynitride, silicon oxide, silicon nitride, silicon oxynitride, chromium oxide, tantalum oxide, tantalum nitride, tantalum oxynitride, alloys thereof, or any combination thereof.

In one or more embodiments, a method for depositing a protective coating on an aerospace component includes sequentially exposing the aerospace component to an aluminum precursor and one or more reactants to form an aluminum-containing layer on a surface the aerospace component by an ALD process. In some examples, the reactant can be or contain one or more oxidizing agents and/or one or more nitriding agents. The oxidizing agent can be or contain water, ozone, oxygen ($O_2$), atomic oxygen, nitrous oxide, one or more peroxides (e.g., hydrogen peroxide, other inorganic peroxides, organic peroxides), one or more alcohols (e.g., methanol, ethanol, propanol, or higher alcohols), plasmas thereof, or any combination thereof. The nitriding agent can be or contain ammonia, nitric oxide, atomic nitrogen, a hydrazine, plasmas thereof, or any combination thereof. The aluminum-containing layer contains aluminum oxide, aluminum nitride, aluminum oxynitride, or any combination thereof.

In other embodiments, a method for depositing a protective coating on an aerospace component includes sequentially exposing the aerospace component to a chromium precursor and a reactant to form a chromium-containing layer on a surface the aerospace component by an ALD process. The chromium-containing layer contains metallic chromium, chromium oxide, chromium nitride, chromium carbide, chromium silicide, or any combination thereof.

In some embodiments, a nanolaminate film stack is formed on the surface of the aerospace component, where the nanolaminate film stack contains alternating layers of the chromium-containing layer and a second deposited layer. The aerospace component can be sequentially exposed to a metal or silicon precursor and a second reactant to form the second deposited layer on the surface by ALD. The second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof. The nanolaminate film stack containing the alternating layers of the chromium-containing layer and the second deposited layer can be used as the protective coating on the aerospace component. Alternatively, in other embodiments, the nanolaminate film stack disposed on the aerospace component can be exposed to an annealing process to convert the nanolaminate film stack into a coalesced film, which can be used as the protective coating on the aerospace component.

In one or more embodiments, the protective coating contains a nanolaminate film stack containing one pair or a plurality of pairs of a first deposited layer and a second deposited layer sequentially deposited or otherwise formed on the aerospace component. The nanolaminate film stack is illustrated with four pairs of the first and second deposited layers, however, the nanolaminate film stack can contain any number of the first and second deposited layers, as further discussed below. For example, the nanolaminate film stack can contain from one pair of the first and second deposited layers to about 150 pairs of the first and second deposited layers. In other embodiments, not shown, the protective coating is not a nanolaminate film stack, but instead contains the first deposited layer or the second deposited layer deposited or otherwise formed on the aerospace component. In further embodiments, the nanolaminate film stack containing one or more pairs of the first and second deposited layers are initially deposited, then is converted to a coalesced film or a crystalline film.

In other embodiments, the protective coating contains a nanolaminate film stack. The nanolaminate film stack contains a first deposited layer and a second deposited layer, and the method further includes depositing from 2 pairs to about 500 pairs of the first deposited layer and the second deposited layer while increasing a thickness of the nanolaminate film stack. In one or more examples, each pair of the first deposited layer and the second deposited layer can have a thickness of about 0.2 nm to about 500 nm. In some examples, the method further includes annealing the aerospace component and converting the nanolaminate film stack into a coalesced film or a crystalline film.

The aerospace component can be exposed to a first precursor and a first reactant to form the first deposited layer on the aerospace component by a vapor deposition process. The vapor deposition process can be an ALD process, a plasma-enhanced ALD (PE-ALD) process, a thermal chemical vapor deposition (CVD) process, a plasma-enhanced CVD (PE-CVD) process, a pulsed-CVD process, or any combination thereof.

In one or more embodiments, the vapor deposition process is an ALD process and the method includes sequentially exposing the surface of the aerospace component to the first precursor and the first reactant to form the first deposited layer. Each cycle of the ALD process includes exposing the surface of the aerospace component to the first precursor, conducting a pump-purge, exposing the aerospace component to the first reactant, and conducting a pump-purge to form the first deposited layer. The order of the first precursor and the first reactant can be reversed, such that the ALD cycle includes exposing the surface of the aerospace component to the first reactant, conducting a pump-purge, exposing the aerospace component to the first precursor, and conducting a pump-purge to form the first deposited layer.

In some examples, during each ALD cycle, the aerospace component is exposed to the first precursor for about 0.1 seconds to about 10 seconds, the first reactant for about 0.1 seconds to about 10 seconds, and the pump-purge for about 0.5 seconds to about 30 seconds. In other examples, during each ALD cycle, the aerospace component is exposed to the first precursor for about 0.5 seconds to about 3 seconds, the first reactant for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the first deposited layer. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the first deposited layer.

In other embodiments, the vapor deposition process is a CVD process and the method includes simultaneously exposing the aerospace component to the first precursor and the first reactant to form the first deposited layer. During an ALD process or a CVD process, each of the first precursor and the first reactant can independent include one or more carrier gases. One or more purge gases can be flowed across the aerospace component and/or throughout the processing chamber in between the exposures of the first precursor and the first reactant. In some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

The first deposited layer can have a thickness of about 0.1 nm, about 0.2 nm, about 0.3 nm, about 0.4 nm, about 0.5 nm, about 0.8 nm, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, or about 150 nm. For example, the first deposited layer can have a thickness of about 0.1 nm to about 150 nm, about 0.2 nm to about 150 nm, about 0.2 nm to about 120 nm, about 0.2 nm to about 100 nm, about 0.2 nm to about 80 nm, about 0.2 nm to about 50 nm, about 0.2 nm to about 40 nm, about 0.2 nm to about 30 nm, about 0.2 nm to about 20 nm, about 0.2 nm to about 10 nm, about 0.2 nm to about 5 nm, about 0.2 nm to about 1 nm, about 0.2 nm to about 0.5 nm, about 0.5 nm to about 150 nm, about 0.5 nm to about 120 nm, about 0.5 nm to about 100 nm, about 0.5 nm to about 80 nm, about 0.5 nm to about 50 nm, about 0.5 nm to about 40 nm, about 0.5 nm to about 30 nm, about 0.5 nm to about 20 nm, about 0.5 nm to about 10 nm, about 0.5 nm to about 5 nm, about 0.5 nm to about 1 nm, about 2 nm to about 150 nm, about 2 nm to about 120 nm, about 2 nm to about 100 nm, about 2 nm to about 80 nm, about 2 nm to about 50 nm, about 2 nm to about 40 nm, about 2 nm to about 30 nm, about 2 nm to about 20 nm, about 2 nm to about 10 nm, about 2 nm to about 5 nm, about 2 nm to about 3 nm, about 10 nm to about 150 nm, about 10 nm to about 120 nm, about 10 nm to about 100 nm, about 10 nm to about 80 nm, about 10 nm to about 50 nm, about 10 nm to about 40 nm, about 10 nm to about 30 nm, about 10 nm to about 20 nm, or about 10 nm to about 15 nm.

In one or more embodiments, the first precursor contains one or more chromium precursors, one or more aluminum precursors, or one or more hafnium precursors. The first reactant contains one or more reducing agents, one or more oxidizing agents, one or more nitriding agents, one or more silicon precursors, one or more carbon precursors, or any combination thereof. In some examples, the first deposited layer is a chromium-containing layer which can be or include metallic chromium, chromium oxide, chromium nitride, chromium silicide, chromium carbide, or any combination thereof. In other examples, the first deposited layer is an aluminum-containing layer which can be or include metallic aluminum, aluminum oxide, aluminum nitride, aluminum silicide, aluminum carbide, or any combination thereof. In further examples, the first deposited layer is a hafnium-containing layer which can be or include metallic hafnium, hafnium oxide, hafnium nitride, hafnium silicide, hafnium carbide, or any combination thereof.

The chromium precursor can be or include one or more of chromium cyclopentadiene compounds, chromium carbonyl compounds, chromium acetylacetonate compounds, chromium diazadienyl compounds, substitutes thereof, complexes thereof, abducts thereof, salts thereof, or any combination thereof. Exemplary chromium precursor can be or include bis(cyclopentadiene) chromium ($Cp_2Cr$), bis(pentamethylcyclopentadiene) chromium (($Me_5Cp)_2Cr$), bis(isopropylcyclopentadiene) chromium (($iPrCp)_2Cr$), bis(ethylbenzene) chromium (($EtBz)_2Cr$), chromium hexacarbonyl ($Cr(CO)_6$), chromium acetylacetonate ($Cr(acac)_3$, also known as, tris(2,4-pentanedione) chromium), chromium hexafluoroacetylacetonate ($Cr(hfac)_3$), chromium(III) tris(2,2,6,6-tetramethyl-3,5-heptanedionate) ($Cr(tmhd)_3$), chromium(II) bis(1,4-ditertbutyldiazadienyl), isomers thereof, complexes thereof, abducts thereof, salts thereof, or any combination thereof. Exemplary chromium diazadienyl compounds can have a chemical formula of:

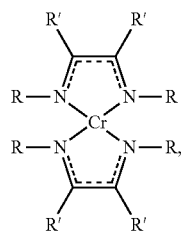

where each R and R' is independently selected from H, C1-C6 alkyl, aryl, acyl, alkylamido, hydrazido, silyl, aldehyde, keto, C2-C4 alkenyl, alkynyl, or substitutes thereof. In some examples, each R is independently a C1-C6 alkyl which is selected from methyl, ethyl, propyl, butyl, or isomers thereof, and R' is H. For example, R is methyl and R' is H, R is ethyl and R' is H, R is iso-propyl and R' is H, or R is tert-butyl and R' is H.

The aluminum precursor can be or include one or more of aluminum alkyl compounds, one or more of aluminum alkoxy compounds, one or more of aluminum acetylacetonate compounds, substitutes thereof, complexes thereof, abducts thereof, salts thereof, or any combination thereof. Exemplary aluminum precursors can be or include trimethylaluminum, triethylaluminum, tripropylaluminum, tributylaluminum, trimethoxyaluminum, triethoxyaluminum, tripropoxyaluminum, tributoxyaluminum, aluminum acetylacetonate ($Al(acac)_3$, also known as, tris(2,4-pentanedione) aluminum), aluminum hexafluoroacetylacetonate ($Al(hfac)_3$), trisdipivaloylmethanatoaluminum ($DPM_3Al$; $(C_{11}H_{19}O_2)_3Al$), isomers thereof, complexes thereof, abducts thereof, salts thereof, or any combination thereof.

In one or more examples, the precursor is or contains one or more aluminum alkyl compounds, such as trimethyl aluminum (TMA). The aluminum alkyl compound (e.g., TMA) has a purity of greater than 95%, greater than 97%, or greater than 99%, such as about 99.3%, about 99.5 wt %, about 99.7 wt %, or about 99.9 wt % to about 99.95 wt %, about 99.99 wt %, about 99.995 wt %, about 99.999 wt %, about 99.9999 wt %, or greater. In one or more examples, the aluminum alkyl compound (e.g., TMA) has a purity of 99.5 wt % or greater, such as about 99.9 wt % to about 99.999 wt %.

The hafnium precursor can be or include one or more of hafnium cyclopentadiene compounds, one or more of hafnium amino compounds, one or more of hafnium alkyl compounds, one or more of hafnium alkoxy compounds, substitutes thereof, complexes thereof, abducts thereof, salts thereof, or any combination thereof. Exemplary hafnium precursors can be or include bis(methylcyclopentadiene) dimethylhafnium (($MeCp)_2HfMe_2$), bis(methylcyclopentadiene) methylmethoxyhafnium (($MeCp)_2Hf(OMe)(Me)$), bis(cyclopentadiene) dimethylhafnium (($Cp)_2HfMe_2$), tetra (tert-butoxy) hafnium, hafnium isopropoxide (($iPrO)_4Hf$), tetrakis(dimethylamino) hafnium (TDMAH), tetrakis(diethylamino) hafnium (TDEAH), tetrakis(ethylmethylamino) hafnium (TEMAH), isomers thereof, complexes thereof, abducts thereof, salts thereof, or any combination thereof.

The titanium precursor can be or include one or more of titanium cyclopentadiene compounds, one or more of titanium amino compounds, one or more of titanium alkyl compounds, one or more of titanium alkoxy compounds, substitutes thereof, complexes thereof, abducts thereof, salts thereof, or any combination thereof. Exemplary titanium precursors can be or include bis(methylcyclopentadiene) dimethyltitanium (($MeCp)_2TiMe_2$), bis(methylcyclopentadiene) methylmethoxytitanium (($MeCp)_2Ti(OMe)(Me)$), bis (cyclopentadiene) dimethyltitanium (($Cp)_2TiMe_2$), tetra (tert-butoxy) titanium, titanium isopropoxide (($iPrO)_4Ti$), tetrakis(dimethylamino) titanium (TDMAT), tetrakis(diethylamino) titanium (TDEAT), tetrakis(ethylmethylamino) titanium (TEMAT), isomers thereof, complexes thereof, abducts thereof, salts thereof, or any combination thereof.

In one or more examples, the first deposited layer is a chromium-containing layer which can be or include metallic chromium and the first reactant contains one or more reducing agents. In some examples, the first deposited layer is an aluminum-containing layer which can be or include metallic aluminum and the first reactant contains one or more reducing agents. In other examples, the first deposited layer is a hafnium-containing layer which can be or include metallic hafnium and the first reactant contains one or more reducing agents. Exemplary reducing agents can be or include hydrogen ($H_2$), ammonia, hydrazine, one or more hydrazine compounds, one or more alcohols, a cyclohexadiene, a dihydropyrazine, an aluminum containing compound, abducts thereof, salts thereof, plasma derivatives thereof, or any combination thereof.

In some examples, the first deposited layer is a chromium-containing layer which can be or include chromium oxide and the first reactant contains one or more oxidizing agents. In other examples, the first deposited layer is an aluminum-containing layer which can be or include aluminum oxide and the first reactant contains one or more oxidizing agents.

In further examples, the first deposited layer is a hafnium-containing layer which can be or include hafnium oxide and the first reactant contains one or more oxidizing agents. Exemplary oxidizing agents can be or include water (e.g., steam), oxygen ($O_2$), atomic oxygen, ozone, nitrous oxide, one or more peroxides, one or more alcohols, plasmas thereof, or any combination thereof.

In one or more examples, the first deposited layer is a chromium-containing layer which can be or include chromium nitride and the first reactant contains one or more nitriding agents. In other examples, the first deposited layer is an aluminum-containing layer which can be or include aluminum nitride and the first reactant contains one or more nitriding agents. In some examples, the first deposited layer is a hafnium-containing layer which can be or include hafnium nitride and the first reactant contains one or more nitriding agents. Exemplary nitriding agents can be or include ammonia, atomic nitrogen, one or more hydrazines, nitric oxide, plasmas thereof, or any combination thereof.

In one or more examples, the first deposited layer is a chromium-containing layer which can be or include chromium silicide and the first reactant contains one or more silicon precursors. In some examples, the first deposited layer is an aluminum-containing layer which can be or include aluminum silicide and the first reactant contains one or more silicon precursors. In other examples, the first deposited layer is a hafnium-containing layer which can be or include hafnium silicide and the first reactant contains one or more silicon precursors. Exemplary silicon precursors can be or include silane, disilane, trisilane, tetrasilane, pentasilane, hexasilane, monochlorosilane, dichlorosilane, trichlorosilane, tetrachlorosilane, hexachlorosilane, substituted silanes, plasma derivatives thereof, or any combination thereof.

In some examples, the first deposited layer is a chromium-containing layer which can be or include chromium carbide and the first reactant contains one or more carbon precursors. In other examples, the first deposited layer is an aluminum-containing layer which can be or include aluminum carbide and the first reactant contains one or more carbon precursors. In further examples, the first deposited layer is a hafnium-containing layer which can be or include hafnium carbide and the first reactant contains one or more carbon precursors. Exemplary carbon precursors can be or include one or more alkanes, one or more alkenes, one or more alkynes, substitutes thereof, plasmas thereof, or any combination thereof.

In some embodiments, the aerospace component can be exposed to a second precursor and a second reactant to form the second deposited layer on the first deposited layer by an ALD process producing nanolaminate film. The first deposited layer and second deposited layer have different compositions from each other. In some examples, the first precursor is a different precursor than the second precursor, such as that the first precursor is a source of a first type of metal and the second precursor is a source of a second type of metal and the first and second types of metal are different.

The second precursor can be or include one or more aluminum precursors one or more hafnium precursors, one or more yttrium precursors, or any combination thereof. The second reactant can be any other reactants used as the first reactant. For example, the second reactant can be or include one or more reducing agents, one or more oxidizing agents, one or more nitriding agents, one or more silicon precursors, one or more carbon precursors, or any combination thereof, as described and discussed above. During the ALD process, each of the second precursor and the second reactant can independent include one or more carrier gases. One or more purge gases can be flowed across the aerospace component and/or throughout the processing chamber in between the exposures of the second precursor and the second reactant. In some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

In one or more embodiments, the second deposited layer contains aluminum oxide, aluminum nitride, silicon oxide, silicon nitride, silicon carbide, yttrium oxide, yttrium nitride, yttrium silicon nitride, hafnium oxide, hafnium nitride, hafnium silicide, hafnium silicate, titanium oxide, titanium nitride, titanium silicide, titanium silicate, or any combination thereof. In one or more examples, if the first deposited layer contains aluminum oxide or aluminum nitride, then the second deposited layer does not contain aluminum oxide or aluminum nitride. Similarly, if the first deposited layer contains hafnium oxide or hafnium nitride, then the second deposited layer does not contain hafnium oxide or hafnium nitride.

Each cycle of the ALD process includes exposing the aerospace component to the second precursor, conducting a pump-purge, exposing the aerospace component to the second reactant, and conducting a pump-purge to form the second deposited layer. The order of the second precursor and the second reactant can be reversed, such that the ALD cycle includes exposing the surface of the aerospace component to the second reactant, conducting a pump-purge, exposing the aerospace component to the second precursor, and conducting a pump-purge to form the second deposited layer.

In one or more examples, during each ALD cycle, the aerospace component is exposed to the second precursor for about 0.1 seconds to about 10 seconds, the second reactant for about 0.1 seconds to about 10 seconds, and the pump-purge for about 0.5 seconds to about 30 seconds. In other examples, during each ALD cycle, the aerospace component is exposed to the second precursor for about 0.5 seconds to about 3 seconds, the second reactant for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the second deposited layer. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the second deposited layer.

The second deposited layer can have a thickness of about 0.1 nm, about 0.2 nm, about 0.3 nm, about 0.4 nm, about 0.5 nm, about 0.8 nm, about 1 nm, about 2 nm, about 3 nm, about 5 nm, about 8 nm, about 10 nm, about 12 nm, or about 15 nm to about 18 nm, about 20 nm, about 25 nm, about 30 nm, about 40 nm, about 50 nm, about 60 nm, about 80 nm, about 100 nm, about 120 nm, or about 150 nm. For example, the second deposited layer can have a thickness of about 0.1 nm to about 150 nm, about 0.2 nm to about 150 nm, about 0.2 nm to about 120 nm, about 0.2 nm to about 100 nm, about 0.2 nm to about 80 nm, about 0.2 nm to about 50 nm, about 0.2 nm to about 40 nm, about 0.2 nm to about 30 nm, about 0.2 nm to about 20 nm, about 0.2 nm to about 10 nm, about 0.2 nm to about 5 nm, about 0.2 nm to about 1 nm, about 0.2 nm to about 0.5 nm, about 0.5 nm to about 150 nm, about 0.5 nm to about 120 nm, about 0.5 nm to about 100 nm, about 0.5 nm to about 80 nm, about 0.5 nm to about 50 nm, about 0.5 nm to about 40 nm, about 0.5 nm to about 30 nm, about 0.5 nm to about 20 nm, about 0.5 nm to about 10 nm, about 0.5 nm to about 5 nm, about 0.5 nm to about 1 nm, about 2 nm to about 150 nm, about 2 nm to about 120 nm, about 2 nm to about 100 nm, about 2 nm to about 80 nm, about 2 nm to about 50 nm, about 2 nm to about 40 nm, about 2 nm to about 30 nm, about 2 nm to about 20 nm, about 2 nm to about 10 nm, about 2 nm to about 5 nm, about 2 nm to about 3 nm, about 10 nm to about 150 nm, about 10 nm to about 120 nm, about 10 nm to about 100 nm, about 10 nm to about 80 nm, about 10 nm to about 50 nm, about 10 nm to about 40 nm, about 10 nm to about 30 nm, about 10 nm to about 20 nm, or about 10 nm to about 15 nm.

In some examples, the first deposited layer is a chromium-containing layer that contains chromium oxide, chromium nitride, or a combination thereof, and the second deposited layer contains one or more of aluminum oxide, silicon nitride, hafnium oxide, hafnium silicate, titanium oxide, or any combination thereof.

In one or more embodiments, the protective coating or the nanolaminate film stack can contain from 1, 2, 3, 4, 5, 6, 7, 8, or 9 pairs of the first and second deposited layers to about 10, about 12, about 15, about 20, about 25, about 30, about 40, about 50, about 65, about 80, about 100, about 120, about 150, about 200, about 250, about 300, about 500, about 800, or about 1,000 pairs of the first and second deposited layers. For example, the nanolaminate film stack can contain from 1 to about 1,000, 1 to about 800, 1 to about 500, 1 to about 300, 1 to about 250, 1 to about 200, 1 to about 150, 1 to about 120, 1 to about 100, 1 to about 80, 1 to about 65, 1 to about 50, 1 to about 30, 1 to about 20, 1 to about 15, 1 to about 10, 1 to about 8, 1 to about 6, 1 to 5, 1 to 4, 1 to 3, about 5 to about 150, about 5 to about 120, about 5 to about 100, about 5 to about 80, about 5 to about 65, about 5 to about 50, about 5 to about 30, about 5 to about 20, about 5 to about 15, about 5 to about 10, about 5 to about 8, about 5 to about 7, about 10 to about 150, about 10 to about 120, about 10 to about 100, about 10 to about 80, about 10 to about 65, about 10 to about 50, about 10 to about 30, about 10 to about 20, about 10 to about 15, or about 10 to about 12 pairs of the first and second deposited layers.

The protective coating or the nanolaminate film stack can have a thickness of about 1 nm, about 2 nm, about 3 nm, about 5 nm, about 8 nm, about 10 nm, about 12 nm, about 15 nm, about 20 nm, about 30 nm, about 50 nm, about 60 nm, about 80 nm, about 100 nm, or about 120 nm to about 150 nm, about 180 nm, about 200 nm, about 250 nm, about 300 nm, about 350 nm, about 400 nm, about 500 nm, about 800 nm, about 1,000 nm, about 2,000 nm, about 3,000 nm, about 4,000 nm, about 5,000 nm, about 6,000 nm, about 7,000 nm, about 8,000 nm, about 9,000 nm, about 10,000 nm, or thicker. In some examples, the protective coating or the nanolaminate film stack can have a thickness of less than 10 µm (less than 10,000 nm). For example, the protective coating or the nanolaminate film stack can have a thickness of about 1 nm to less than 10,000 nm, about 1 nm to about 8,000 nm, about 1 nm to about 6,000 nm, about 1 nm to about 5,000 nm, about 1 nm to about 3,000 nm, about 1 nm to about 2,000 nm, about 1 nm to about 1,500 nm, about 1 nm to about 1,000 nm, about 1 nm to about 500 nm, about 1 nm to about 400 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 20 nm to about 500 nm, about 20 nm to about 400 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 30 nm to about 400 nm, about 30 nm to about 200 nm, about 50 nm to about 500 nm, about 50 nm to about 400 nm, about 50 nm to about 300 nm, about 50 nm to about 250 nm, about 50 nm to about 200 nm, about 50 nm to about 150 nm, about 50 nm to about 100 nm, about 80 nm to about 250 nm, about 80 nm to about 200 nm, about 80 nm to about 150 nm, about 80 nm to about 100 nm, about 50 nm to about 80 nm, about 100 nm to about 500 nm, about 100 nm to about 400 nm, about 100 nm to about 300 nm, about 100 nm to about 250 nm, about 100 nm to about 200 nm, or about 100 nm to about 150 nm.

In some embodiments, the nanolaminate film stack can optionally be exposed to one or more annealing processes. In some examples, the nanolaminate film stack can be converted into the coalesced film or crystalline film during the annealing process. During the annealing process, the high temperature coalesces the layers within the nanolaminate film stack into a single structure where the new crystalline assembly enhances the integrity and protective properties of the coalesced film or crystalline film. In other examples, the nanolaminate film stack can be heated and densified during the annealing process, but still maintained as a nanolaminate film stack. The annealing process can be or include a thermal anneal, a plasma anneal, an ultraviolet anneal, a laser anneal, or any combination thereof.

The nanolaminate film stack disposed on the aerospace component is heated to a temperature of about 400° C., about 500° C., about 600° C., or about 700° C. to about 750° C., about 800° C., about 900° C., about 1,000° C., about 1,100° C., about 1,200° C., or greater during the annealing process. For example, the nanolaminate film stack disposed on the aerospace component is heated to a temperature of about 400° C. to about 1,200° C., about 400° C. to about 1,100° C., about 400° C. to about 1,000° C., about 400° C. to about 900° C., about 400° C. to about 800° C., about 400° C. to about 700° C., about 400° C. to about 600° C., about 400° C. to about 500° C., about 550° C. to about 1,200° C., about 550° C. to about 1,100° C., about 550° C. to about 1,000° C., about 550° C. to about 900° C., about 550° to about 800° C., about 550° C. to about 700° C., about 550° C. to about 600° C., about 700° C. to about 1,200° C., about 700° C. to about 1,100° C., about 700° C. to about 1,000° C., about 700° C. to about 900° C., about 700° C. to about 800° C., about 850° C. to about 1,200° C., about 850° C. to about 1,100° C., about 850° C. to about 1,000° C., or about 850° C. to about 900° C. during the annealing process.

The nanolaminate film stack can be under a vacuum at a low pressure (e.g., from about 0.1 Torr to less than 760 Torr), at ambient pressure (e.g., about 760 Torr), and/or at a high pressure (e.g., from greater than 760 Torr (1 atm) to about 3,678 Torr (about 5 atm)) during the annealing process. The nanolaminate film stack can be exposed to an atmosphere containing one or more gases during the annealing process. Exemplary gases used during the annealing process can be or include nitrogen ($N_2$), argon, helium, hydrogen ($H_2$), oxygen ($O_2$), or any combinations thereof. The annealing process can be performed for about 0.01 seconds to about 10 minutes. In some examples, the annealing process can be a thermal anneal and lasts for about 1 minute, about 5 minutes, about 10 minutes, or about 30 minutes to about 1 hour, about 2 hours, about 5 hours, or about 24 hours. In other examples, the annealing process can be a laser anneal or a spike anneal and lasts for about 1 millisecond, about 100 millisecond, or about 1 second to about 5 seconds, about 10 seconds, or about 15 seconds.

The protective coating or the coalesced film or crystalline film can have a thickness of about 1 nm, about 2 nm, about 3 nm, about 5 nm, about 8 nm, about 10 nm, about 12 nm, about 15 nm, about 20 nm, about 30 nm, about 50 nm, about 60 nm, about 80 nm, about 100 nm, or about 120 nm to about 150 nm, about 180 nm, about 200 nm, about 250 nm, about 300 nm, about 350 nm, about 400 nm, about 500 nm, about 700 nm, about 850 nm, about 1,000 nm, about 1,200 nm, about 1,500 nm, about 2,000 nm, about 3,000 nm, about 4,000 nm, about 5,000 nm, about 6,000 nm, about 7,000 nm, about 8,000 nm, about 9,000 nm, about 10,000 nm, or thicker. In some examples, the protective coating or the coalesced film or crystalline film can have a thickness of less than 10 μm (less than 10,000 nm). For example, the protective coating or the coalesced film or crystalline film can have a thickness of about 1 nm to less than 10,000 nm, about 1 nm to about 8,000 nm, about 1 nm to about 6,000 nm, about 1 nm to about 5,000 nm, about 1 nm to about 3,000 nm, about 1 nm to about 2,000 nm, about 1 nm to about 1,500 nm, about 1 nm to about 1,000 nm, about 1 nm to about 500 nm, about 1 nm to about 400 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 20 nm to about 500 nm, about 20 nm to about 400 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 30 nm to about 400 nm, about 30 nm to about 200 nm, about 50 nm to about 500 nm, about 50 nm to about 400 nm, about 50 nm to about 300 nm, about 50 nm to about 250 nm, about 50 nm to about 200 nm, about 50 nm to about 150 nm, about 50 nm to about 100 nm, about 80 nm to about 250 nm, about 80 nm to about 200 nm, about 80 nm to about 150 nm, about 80 nm to about 100 nm, about 50 nm to about 80 nm, about 100 nm to about 500 nm, about 100 nm to about 400 nm, about 100 nm to about 300 nm, about 100 nm to about 250 nm, about 100 nm to about 200 nm, or about 100 nm to about 150 nm.

In one or more embodiments, the protective coating can have a relatively high degree of uniformity. The protective coating can have a uniformity of less than 50%, less than 40%, or less than 30% of the thickness of the respective protective coating. The protective coating can have a uniformity from about 0%, about 0.5%, about 1%, about 2%, about 3%, about 5%, about 8%, or about 10% to about 12%, about 15%, about 18%, about 20%, about 22%, about 25%, about 28%, about 30%, about 35%, about 40%, about 45%, or less than 50% of the thickness. For example, the protective coating can have a uniformity from about 0% to about 50%, about 0% to about 40%, about 0% to about 30%, about 0% to less than 30%, about 0% to about 28%, about 0% to about 25%, about 0% to about 20%, about 0% to about 15%, about 0% to about 10%, about 0% to about 8%, about 0% to about 5%, about 0% to about 3%, about 0% to about 2%, about 0% to about 1%, about 1% to about 50%, about 1% to about 40%, about 1% to about 30%, about 1% to less than 30%, about 1% to about 28%, about 1% to about 25%, about 1% to about 20%, about 1% to about 15%, about 1% to about 10%, about 1% to about 8%, about 1% to about 5%, about 1% to about 3%, about 1% to about 2%, about 5% to about 50%, about 5% to about 40%, about 5% to about 30%, about 5% to less than 30%, about 5% to about 28%, about 5% to about 25%, about 5% to about 20%, about 5% to about 15%, about 5% to about 10%, about 5% to about 8%, about 10% to about 50%, about 10% to about 40%, about 10% to about 30%, about 10% to less than 30%, about 10% to about 28%, about 10% to about 25%, about 10% to about 20%, about 10% to about 15%, or about 10% to about 12% of the thickness.

In some embodiments, the protective coating can contain, be formed with, or otherwise produced with different ratios of metals throughout the material, such as one or more doping metals and/or one or more grading metals contained within a base metal, where any of the metals can be in any chemically oxidized form or state (e.g., oxide, nitride, silicide, carbide, or combinations thereof). In one or more examples, the first deposited layer is deposited to first thickness and the second deposited layer is deposited to a second thickness. The first thickness can be the same as the second thickness or the first thickness can be different than (less than or greater than) the second thickness. For example, the first deposited layer can be deposited by two or more (3, 4, 5, 6, 7, 8, 9, 10, or more) ALD cycles to produce the respectively same amount of sub-layers (e.g., one sub-layer for each ALD cycle), and then the second deposited layer can be deposited by one ALD cycle or a number of ALD cycles that is less than or greater than the number of ALD cycles used to deposit the first deposited layer. In other examples, the first deposited layer can be deposited by CVD to a first thickness and the second deposited layer is deposited by ALD to a second thickness which is less than the first thickness.

In other embodiments, an ALD process can be used to deposit the first deposited layer and/or the second deposited layer where the deposited material is doped by including a dopant precursor during the ALD process. In some examples, the dopant precursor can be included a separate ALD cycle relative to the ALD cycles used to deposit the base material. In other examples, the dopant precursor can be co-injected with any of the chemical precursors used during the ALD cycle. In further examples, the dopant precursor can be injected separate from the chemical precursors during the ALD cycle. For example, one ALD cycle can include exposing the aerospace component to: the first precursor, a pump-purge, the dopant precursor, a pump-purge, the first reactant, and a pump-purge to form the deposited layer. In some examples, one ALD cycle can include exposing the aerospace component to: the dopant precursor, a pump-purge, the first precursor, a pump-purge, the first reactant, and a pump-purge to form the deposited layer. In other examples, one ALD cycle can include exposing the aerospace component to: the first precursor, the dopant precursor, a pump-purge, the first reactant, and a pump-purge to form the deposited layer.

In one or more embodiments, the first deposited layer and/or the second deposited layer contains one or more base materials and one or more doping materials. The base material is or contains aluminum oxide, chromium oxide, or a combination of aluminum oxide and chromium oxide. The doping material is or contains hafnium, hafnium oxide, yttrium, yttrium oxide, cerium, cerium oxide, silicon, silicon oxide, nitrides thereof, or any combination thereof. Any of the precursors or reagents described herein can be used as a doping precursor or a dopant. Exemplary cerium precursor can be or include one or more cerium(IV) tetra(2,2,6,6-tetramethyl-3,5-heptanedionate) (Ce(TMHD)$_4$), tris(cyclopentadiene) cerium (($C_5H_5$)$_3$Ce), tris(propylcyclopentadiene) cerium ([($C_3H_7$)$C_5H_4$]$_3$Ce), tris (tetramethylcyclopentadiene) cerium ([($CH_3$)$_4C_5$H]$_3$Ce), or any combination thereof.

The doping material can have a concentration of about 0.01 atomic percent (at %), about 0.05 at %, about 0.08 at %, about 0.1 at %, about 0.5 at %, about 0.8 at %, about 1 at %, about 1.2 at %, about 1.5 at %, about 1.8 at %, or about 2 at % to about 2.5 at %, about 3 at %, about 3.5 at %, about 4 at %, about 5 at %, about 8 at %, about 10 at %, about 15 at %, about 20 at %, about 25 at %, or about 30 at % within the first deposited layer, the second deposited layer, the nanolaminate film stack, and/or the coalesced film or crystalline film. For example, the doping material can have a concentration of about 0.01 at % to about 30 at %, about 0.01 at % to about 25 at %, about 0.01 at % to about 20 at %, about 0.01 at % to about 15 at %, about 0.01 at % to about 12 at %, about 0.01 at % to about 10 at %, about 0.01 at % to about 8 at %, about 0.01 at % to about 5 at %, about 0.01 at % to about 4 at %, about 0.01 at % to about 3 at %, about 0.01 at % to about 2.5 at %, about 0.01 at % to about 2 at %, about 0.01 at % to about 1.5 at %, about 0.01 at % to about 1 at %, about 0.01 at % to about 0.5 at %, about 0.01 at % to about 0.1 at %, about 0.1 at % to about 30 at %, about 0.1 at % to about 25 at %, about 0.1 at % to about 20 at %, about 0.1 at % to about 15 at %, about 0.1 at % to about 12 at %, about 0.1 at % to about 10 at %, about 0.1 at % to about 8 at %, about 0.1 at % to about 5 at %, about 0.1 at % to about 4 at %, about 0.1 at % to about 3 at %, about 0.1 at % to about 2.5 at %, about 0.1 at % to about 2 at %, about 0.1 at % to about 1.5 at %, about 0.1 at % to about 1 at %, about 0.1 at % to about 0.5 at %, about 1 at % to about 30 at %, about 1 at % to about 25 at %, about 1 at % to about 20 at %, about 1 at % to about 15 at %, about 1 at % to about 12 at %, about 1 at % to about 10 at %, about 1 at % to about 8 at %, about 1 at % to about 5 at %, about 1 at % to about 4 at %, about 1 at % to about 3 at %, about 1 at % to about 2.5 at %, about 1 at % to about 2 at %, or about 1 at % to about 1.5 at % within the first deposited layer, the second deposited layer, the nanolaminate film stack, and/or the coalesced film or crystalline film.

In one or more embodiments, the protective coating includes the nanolaminate film stack having the first deposited layer containing aluminum oxide (or other base material) and the second deposited layer containing hafnium oxide (or other doping material), or having the first deposited layer containing hafnium oxide (or other doping material) and the second deposited layer containing aluminum oxide (or other base material). In one or more examples, the protective coating contains a combination of aluminum oxide and hafnium oxide, a hafnium-doped aluminum oxide, hafnium aluminate, or any combination thereof. For example, the protective coating includes the nanolaminate film stack having the first deposited layer contains aluminum oxide and the second deposited layer contains hafnium oxide, or having the first deposited layer contains hafnium oxide and the second deposited layer contains aluminum oxide. In other examples, the protective coating includes the coalesced film or crystalline film formed from layers of aluminum oxide and hafnium oxide. In one or more embodiments, the protective coating has a concentration of hafnium (or other doping material) of about 0.01 at %, about 0.05 at %, about 0.08 at %, about 0.1 at %, about 0.5 at %, about 0.8 at %, or about 1 at % to about 1.2 at %, about 1.5 at %, about 1.8 at %, about 2 at %, about 2.5 at %, about 3 at %, about 3.5 at %, about 4 at %, about 4.5 at %, or about 5 at % within the nanolaminate film stack or the coalesced film or crystalline film containing aluminum oxide (or other base material). For example, the protective coating has a concentration of hafnium (or other doping material) of about 0.01 at % to about 10 at %, about 0.01 at % to about 8 at %, about 0.01 at % to about 5 at %, about 0.01 at % to about 4 at %, about 0.01 at % to about 3 at %, about 0.01 at % to about 2.5 at %, about 0.01 at % to about 2 at %, about 0.01 at % to about 1.5 at %, about 0.01 at % to about 1 at %, about 0.01 at % to about 0.5 at %, about 0.01 at % to about 0.1 at %, about 0.01 at % to about 0.05 at %, about 0.1 at % to about 5 at %, about 0.1 at % to about 4 at %, about 0.1 at % to about 3 at %, about 0.1 at % to about 2.5 at %, about 0.1 at % to about 2 at %, about 0.1 at % to about 1.5 at %, about 0.1 at % to about 1 at %, about 0.1 at % to about 0.5 at %, about 0.5 at % to about 5 at %, about 0.5 at % to about 4 at %, about 0.5 at % to about 3 at %, about 0.5 at % to about 2.5 at %, about 0.5 at % to about 2 at %, about 0.5 at % to about 1.5 at %, about 0.5 at % to about 1 at %, about 1 at % to about 5 at %, about 1 at % to about 4 at %, about 1 at % to about 3 at %, about 1 at % to about 2.5 at %, about 1 at % to about 2 at %, or about 1 at % to about 1.5 at % within the nanolaminate film stack or the coalesced film or crystalline film containing aluminum oxide (or other base material).

Aerospace components as described and discussed herein, including aerospace component, can be or include one or more components or portions thereof of a fuel system, a turbine, an aircraft, a spacecraft, or other devices that can include one or more turbines (e.g., compressors, pumps, turbo fans, super chargers, and the like). Exemplary aerospace components can be or include a fuel nozzle, a combustor liner, a combustor shield, a heat exchanger, a fuel line, a fuel valve, any other part or portion that is exposed to a fuel (e.g., aviation fuel or jet fuel), as well as one or more turbine blades, turbine vanes, ribs, fins, pin fins, an internal cooling channel, or any other aerospace component or part that can benefit from having protective coating deposited thereon, or any combination thereof.

The aerospace component has one or more outer or exterior surfaces and one or more inner or interior surfaces. The protective coating can be deposited or otherwise formed on interior surfaces and/or exterior surfaces of the aerospace components. The interior surfaces can define one or more cavities extending or contained within the aerospace component. The cavities can be channels, passages, spaces, or the like disposed between the interior surfaces. The cavity can have one or more openings. Each of the cavities within the aerospace component typically have aspect ratios (e.g., length divided by width) of greater than 1. The methods described and discussed herein provide depositing and/or otherwise forming the protective coating on the interior surfaces with high aspect ratios (greater than 1) and/or within the cavities.

The aspect ratio of the cavity can be from about 2, about 3, about 5, about 8, about 10, or about 12 to about 15, about 20, about 25, about 30, about 40, about 50, about 65, about 80, about 100, about 120, about 150, about 200, about 250, about 300, about 500, about 800, about 1,000, or greater. For example, the aspect ratio of the cavity can be from about 2 to about 1,000, about 2 to about 500, about 2 to about 200, about 2 to about 150, about 2 to about 120, about 2 to about 100, about 2 to about 80, about 2 to about 50, about 2 to about 40, about 2 to about 30, about 2 to about 20, about 2 to about 10, about 2 to about 8, about 5 to about 1,000, about 5 to about 500, about 5 to about 200, about 5 to about 150, about 5 to about 120, about 5 to about 100, about 5 to about 80, about 5 to about 50, about 5 to about 40, about 5 to about 30, about 5 to about 20, about 5 to about 10, about 5 to about 8, about 10 to about 1,000, about 10 to about 500, about 10 to about 200, about 10 to about 150, about 10 to about 120, about 10 to about 100, about 10 to about 80, about 10 to about 50, about 10 to about 40, about 10 to about 30, about 10 to about 20, about 20 to about 1,000, about 20 to about 500, about 20 to about 200, about 20 to about 150, about 20 to about 120, about 20 to about 100, about 20 to about 80, about 20 to about 50, about 20 to about 40, or about 20 to about 30.

The aerospace component and any surface thereof including one or more outer or exterior surfaces and/or one or more inner or interior surfaces can be made of, contain, or otherwise include one or more metals, such as nickel, chromium, cobalt, chromium-cobalt alloys, molybdenum, iron, titanium, one or more nickel superalloys, one or more Inconel alloys, one or more Hastelloy alloys, one or more Invar alloys, one or more Inovoco alloys, alloys thereof, or any combination thereof. The protective coating can be deposited, formed, or otherwise produced on any surface of the aerospace component including one or more outer or exterior surfaces and/or one or more inner or interior surfaces.

The protective coating, as described and discussed herein, can be or include one or more of laminate film stacks, coalesced films, crystalline film, graded compositions, and/or monolithic films which are deposited or otherwise formed on any surface of an aerospace component. In some examples, the protective coating contains from about 1% to about 100% chromium oxide. The protective coating is conformal and substantially coat rough surface features following surface topology, including in open pores, blind holes, and non-line-of sight regions of a surface. The protective coating does not substantially increase surface roughness, and in some embodiments, the protective coating may reduce surface roughness by conformally coating roughness until it coalesces. The protective coating may contain particles from the deposition that are substantially larger than the roughness of the aerospace component, but are considered separate from the monolithic film. The protective coating is substantially well adhered and pinhole free. The thicknesses of the protective coating can vary within 1-sigma of 40%. In one or more embodiments, the thickness varies less than 1-sigma of 20%, 10%, 5%, 1%, or 0.1%.

In addition to providing protection against coke deposition, the protective coating provides corrosion and oxidation protection when the aerospace components are exposed to air, oxygen, sulfur and/or sulfur compounds, acids, bases, salts (e.g., Na, K, Mg, Li, or Ca salts), or any combination thereof. The aerospace component may be exposed to these conditions during normal operation or during a cleaning process to remove any carbon buildup.

One or more embodiments described herein include methods for the preservation of an underneath chromium-containing alloy using the methods producing an alternating nanolaminate of first material (e.g., chromium oxide, aluminum oxide, and/or aluminum nitride) and another secondary material. The secondary material can be or include one or more of aluminum oxide, aluminum nitride, aluminum oxynitride, silicon oxide, silicon nitride, silicon carbide, yttrium oxide, yttrium nitride, yttrium silicon nitride, hafnium oxide, hafnium silicate, hafnium silicide, hafnium nitride, titanium oxide, titanium nitride, titanium silicide, titanium silicate, dopants thereof, alloys thereof, or any combination thereof. The resultant film can be used as a nanolaminate film stack or the film can be subjected to annealing where the high temperature coalesces the films into a single structure where the new crystalline assembly enhances the integrity and protective properties of this overlying film.

In a particular embodiment, the chromium precursor (at a temperature of about 0° C. to about 250° C.) is delivered to the aerospace component via vapor phase delivery for at pre-determined pulse length of about 5 seconds. During this process, the deposition reactor is operated under a flow of nitrogen carrier gas (about 1,000 sccm total) with the chamber held at a pre-determined temperature of about 350° C. and pressure of about 3.5 Torr. After the pulse of the chromium precursor, the chamber is then subsequently pumped and purged of all requisite gases and byproducts for a determined amount of time. Subsequently, water (or another oxidizing agent) is pulsed into the chamber for about 0.1 seconds at chamber pressure of about 3.5 Torr. An additional chamber purge (or pump/purge) is then performed to rid the reactor of any excess reactants and reaction byproducts. This process is repeated as many times as necessary to get the target chromium oxide film to the desired film thickness.

For the secondary film (example: aluminum oxide), the precursor, trimethylaluminum (at a temperature of about 0° C. to about 30° C.) is delivered to the aerospace component via vapor phase delivery for at pre-determined pulse length of about 0.1 seconds. During this process, the deposition reactor is operated under a flow of nitrogen carrier gas (about 100 sccm total) with the chamber held at a pre-determined temperature of about 150° C. to about 350° C. and pressure about 1 Torr to about 5 Torr. After the pulse of trimethylaluminum, the chamber is then subsequently pumped and purged of all requisite gases and byproducts for a determined amount of time. Subsequently, water vapor is pulsed into the chamber for about 0.1 seconds at chamber pressure of about 3.5 Torr. An additional chamber purge is then performed to rid the reactor of any excess reactants and reaction byproducts. This process is repeated as many times as necessary to get the target aluminum oxide film to the desired film thickness. The aerospace component is then subjected to an annealing furnace at a temperature of about 500° C. under inert nitrogen flow of about 500 sccm for about one hour.

Embodiments of the present disclosure further relate to any one or more of the following paragraphs 1-31:

1. A method for depositing a coating on an aerospace component, comprising: exposing the aerospace component to a cleaning process to produce a cleaned surface on the aerospace component; and sequentially exposing the aerospace component to one or more precursors and one or more reactants to form a protective coating on the cleaned surface of the aerospace component by an atomic layer deposition (ALD) process.

2. The method according to paragraph 1, wherein the aerospace component is a fuel nozzle, a combustor liner, a combustor shield, a heat exchanger, a fuel line, a fuel valve, or any combination thereof.

3. The method according to paragraph 1 or 2, wherein the cleaned surface of the aerospace component is an interior surface of the aerospace component.

4. The method according to any one of paragraphs 1-3, wherein the cleaned surface of the aerospace component has an aspect ratio of about 5 to about 1,000.

5. The method according to any one of paragraphs 1-4, wherein the cleaned surface of the aerospace component has an aspect ratio of about 20 to about 500.

6. The method according to any one of paragraphs 1-5, wherein the cleaned surface of the aerospace component comprises nickel, nickel superalloy, stainless steel, cobalt, chromium, molybdenum, iron, titanium, alloys thereof, or any combination thereof.

7. The method according to any one of paragraphs 1-6, wherein a contaminant is removed from the aerospace component to produce the cleaned surface during the cleaning process.

8. The method according to paragraph 7, wherein the contaminant comprises an oxide, an organic residue, carbon, particulates, or any combination thereof.

9. The method according to any one of paragraphs 1-8, wherein the cleaning process comprises exposing the aerospace component to a solvent clean, an acid clean, a basic clean, a wet clean, an ozone clean, a plasma clean, a sonication, or any combination thereof.

10. The method according to any one of paragraphs 1-9, wherein the protective coating comprises aluminum oxide, aluminum nitride, aluminum oxynitride, silicon oxide, silicon nitride, silicon oxynitride, chromium oxide, tantalum oxide, tantalum nitride, tantalum oxynitride, alloys thereof, or any combination thereof.

11. The method according to any one of paragraphs 1-10, wherein the protective coating reduces or suppresses coke formation when the aerospace component is heated in the presence of a fuel.

12. The method according to any one of paragraphs 1-11, wherein the protective coating has a thickness of about 10 nm to about 5,000 nm.

13. The method according to any one of paragraphs 1-12, wherein the protective coating has a thickness of about 100 nm to about 4,000 nm.

14. The method according to any one of paragraphs 1-13, wherein the protective coating has a thickness of about 500 nm to about 2,000 nm.

15. The method according to any one of paragraphs 1-14, wherein the protective coating has a thickness variation of less than 200%.

16. The method according to any one of paragraphs 1-15, wherein the protective coating has a thickness variation of less than 100%.

17. The method according to any one of paragraphs 1-16, wherein the protective coating has a thickness variation of less than 25%.

18. The method according to any one of paragraphs 1-17, wherein the protective coating has a thickness variation of less than 5%.

19. The method according to any one of paragraphs 1-18, wherein the protective coating has a thickness variation of less than 0.5%.

20. The method according to any one of paragraphs 1-19, wherein the precursor comprises trimethyl aluminum.

21. The method according to paragraph 20, wherein the trimethyl aluminum has a purity of 99.5 wt % or greater.

22. The method according to paragraph 21, wherein the trimethyl aluminum has a purity of about 99.9 wt % to about 99.999 wt %.

23. The method according to any one of paragraphs 1-22, wherein the reactant comprises an oxidizing agent and/or a nitriding agent.

24. The method according to any one of paragraphs 1-23, wherein the reactant comprises the oxidizing agent, and wherein the oxidizing agent comprises water, ozone, oxygen ($O_2$), atomic oxygen, nitrous oxide, a peroxide, an alcohol, plasmas thereof, or any combination thereof.

25. The method according to any one of paragraphs 1-24, wherein the reactant comprises the nitriding agent, and wherein the nitriding agent comprises ammonia, atomic nitrogen, a hydrazine, plasmas thereof, or any combination thereof.

26. The method according to any one of paragraphs 1-25, wherein the precursor comprises an aluminum precursor, and wherein the aluminum precursor comprises a tris(alkyl) aluminum, a tris(alkoxy) aluminum, aluminum diketonates, complexes thereof, abducts thereof, salts thereof, or any combination thereof.

27. The method according to paragraph 26, wherein the aluminum precursor comprises trimethylaluminum, triethylaluminum, tripropylaluminum, tributylaluminum, trimethoxyaluminum, triethoxyaluminum, tripropoxyaluminum, tributoxyaluminum, aluminum acetylacetonate, aluminum hexafluoroacetylacetonate, trisdipivaloylmethanatoaluminum, isomers thereof, complexes thereof, abducts thereof, salts thereof, or any combination thereof.

28. The method according to any one of paragraphs 1-27, wherein the protective coating comprises a nanolaminate film stack.

29. The method according to paragraph 28, wherein the nanolaminate film stack comprises a first deposited layer and a second deposited layer, and the method further comprises depositing from 2 pairs to about 500 pairs of the first deposited layer and the second deposited layer while increasing a thickness of the nanolaminate film stack.

30. The method according to paragraph 29, wherein each pair of the first deposited layer and the second deposited layer has a thickness of about 0.2 nm to about 500 nm.

31. The method according to paragraph 29 or 30, further comprising annealing the aerospace component and converting the nanolaminate film stack into a coalesced film or a crystalline film.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for depositing a coating on an aerospace component, comprising:
    exposing the aerospace component to a cleaning process to produce a cleaned surface on the aerospace component, wherein the aerospace component is a fuel nozzle, a combustor liner, a combustor shield, a heat exchanger, a fuel line, a fuel valve, or any combination thereof, the aerospace component has an aspect ratio of about 8 to about 1,000, wherein the cleaned surface of the aerospace component is an interior surface of the aerospace component, and wherein the cleaning process comprises exposing the aerospace component to a solvent clean, an acid clean, a basic clean, a wet clean, or any combination thereof; and
    sequentially exposing the aerospace component to a precursor and a reactant to form a protective coating on the cleaned surface of the aerospace component by an atomic layer deposition (ALD) process, wherein the protective coating comprises aluminum oxide, silicon oxide, chromium oxide, tantalum oxide, alloys thereof, or any combination thereof.

2. The method of claim 1, wherein the aerospace component is a fuel nozzle.

3. The method of claim 1, wherein the cleaned surface of the aerospace component has an aspect ratio of about 12 to about 1,000.

4. The method of claim 1, wherein the cleaned surface of the aerospace component comprises nickel, nickel superalloy, stainless steel, cobalt, chromium, molybdenum, iron, titanium, alloys thereof, or any combination thereof.

5. The method of claim 1, wherein a contaminant is removed from the aerospace component to produce the cleaned surface during the cleaning process, and wherein the contaminant comprises an oxide, an organic residue, carbon, particulates, or any combination thereof.

6. The method of claim 1, wherein the cleaning process further comprises exposing the aerospace component to an ozone clean, a plasma clean, a sonication, or any combination thereof.

7. The method of claim 1, wherein the protective coating further comprises aluminum nitride, aluminum oxynitride, silicon nitride, silicon oxynitride, tantalum nitride, alloys thereof, or any combination thereof.

8. The method of claim 1, wherein the protective coating reduces or suppresses coke formation when the aerospace component is heated in the presence of a fuel.

9. The method of claim 1, wherein the protective coating has a thickness of about 10 nm to about 5,000 nm.

10. The method of claim 1, wherein the protective coating has a thickness variation of less than 5%.

11. The method of claim 1, wherein the precursor comprises trimethyl aluminum, and wherein the trimethyl aluminum has a purity of about 99.9 wt % to about 99.999 wt %.

12. The method of claim 1, wherein the reactant comprises an oxidizing agent, and wherein the oxidizing agent comprises water, ozone, oxygen ($O_2$), atomic oxygen, nitrous oxide, a peroxide, an alcohol, or any combination thereof.

13. The method of claim 1, wherein the reactant comprises a nitriding agent, and wherein the nitriding agent comprises ammonia, atomic nitrogen, a hydrazine, or any combination thereof.

14. The method of claim 1, wherein the precursor comprises an aluminum precursor, and wherein the aluminum precursor comprises a tris(alkyl) aluminum, a tris(alkoxy) aluminum, aluminum diketonates, complexes thereof, abducts thereof, salts thereof, or any combination thereof.

15. The method of claim 1, wherein the protective coating comprises a nanolaminate film stack, and wherein the nanolaminate film stack comprises a first deposited layer and a second deposited layer, and the method further comprises depositing from 2 pairs to about 500 pairs of the first deposited layer and the second deposited layer while increasing a thickness of the nanolaminate film stack.

16. The method of claim 15, wherein each pair of the first deposited layer and the second deposited layer has a thickness of about 0.2 nm to about 500 nm.

17. The method of claim 15, further comprising annealing the aerospace component and converting the nanolaminate film stack into a coalesced film or a crystalline film.

18. A method for depositing a coating on an aerospace component, comprising:
    exposing the aerospace component to a cleaning process to produce a cleaned surface on the aerospace component, wherein:
        the aerospace component is a fuel nozzle, a combustor liner, a combustor shield, a heat exchanger, a fuel line, a fuel valve, or any combination thereof,
        the cleaned surface of the aerospace component is an interior surface of the aerospace component,
        the cleaned surface of the aerospace component has an aspect ratio of about 40 to about 1,000, and
        the cleaning process comprises exposing the aerospace component to a solvent clean, an acid clean, a basic clean, a wet clean, or any combination thereof; and
    sequentially exposing the aerospace component to a precursor and a reactant to form a protective coating on the cleaned surface of the aerospace component by an atomic layer deposition (ALD) process, wherein the protective coating comprises aluminum oxide, silicon oxide, chromium oxide, tantalum oxide, alloys thereof, or any combination thereof.

19. A method for depositing a coating on an aerospace component, comprising:
    exposing the aerospace component to a cleaning process to produce a cleaned surface on the aerospace component, wherein the cleaning process comprises exposing the aerospace component to a solvent clean, an acid clean, a basic clean, a wet clean, or any combination thereof, wherein the aerospace component is a fuel nozzle, a combustor liner, a combustor shield, a heat exchanger, a fuel line, a fuel valve, or any combination thereof, wherein the cleaned surface of the aerospace component is an interior surface of the aerospace component, and wherein the cleaned surface of the aerospace component has an aspect ratio of about 5 to about 1,000; and sequentially exposing the aerospace component to a precursor and a reactant to form a protective coating on the cleaned surface of the aerospace component by an atomic layer deposition (ALD) process, wherein the protective coating comprises aluminum oxide, silicon oxide, chromium oxide, tantalum oxide, alloys thereof, or any combination thereof, wherein the protective coating has a thickness of about 10 nm to about 5,000 nm, and wherein the protective coating has a thickness variation of less than 50%.

20. The method of claim 19, wherein the cleaned surface of the aerospace component has an aspect ratio of about 12 to about 1,000.

* * * * *